(12) United States Patent
Liu

(10) Patent No.: US 7,239,565 B2
(45) Date of Patent: Jul. 3, 2007

(54) MEMORY ARRAY WITH PRECHARGE CONTROL CIRCUIT

(75) Inventor: Yichiuh Liu, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 42 days.

(21) Appl. No.: 10/954,250

(22) Filed: Sep. 29, 2004

(65) Prior Publication Data

US 2006/0067144 A1   Mar. 30, 2006

(51) Int. Cl.
   *G11C 7/00*   (2006.01)
   *G11C 8/00*   (2006.01)
(52) U.S. Cl. .................. 365/203; 365/63; 365/133; 365/185.25
(58) Field of Classification Search ........... 365/203, 365/203.03, 233, 63, 194, 185.25
See application file for complete search history.

(56) References Cited

U.S. PATENT DOCUMENTS

| | | | | |
|---|---|---|---|---|
| 5,623,450 A | * | 4/1997 | Phillips et al. | ............... 365/203 |
| 5,675,529 A | * | 10/1997 | Poole | ......................... 365/203 |
| 5,701,269 A | * | 12/1997 | Fujii | ......................... 365/203 |
| 6,396,732 B1 | * | 5/2002 | Osada et al. | ................. 365/203 |
| 6,434,071 B1 | * | 8/2002 | Labrecque | .................. 365/203 |
| 6,564,331 B1 | | 5/2003 | Joshi | |
| 6,629,194 B2 | * | 9/2003 | Kumar et al. | .......... 365/185.25 |

\* cited by examiner

*Primary Examiner*—Trong Phan
(74) *Attorney, Agent, or Firm*—Schwabe, Williamson & Wyatt, P.C.

(57) ABSTRACT

In one embodiment, a memory apparatus is provided with at least one local bit-line; a precharge control circuit, coupled to the at least one local bit-line, and adapted to be operable to initiate a precharge pulse after the at least one local bit-line is discharged and to terminate the precharge pulse after the at least one local bit-line has been precharged; a precharge pull-up device, coupled to the precharge control circuit, a first voltage source, and the at least one local bit-line, and adapted to be operable to connect the first voltage source to the at least one local bit-line during the precharge pulse to precharge the at least one local bit-line; and a selected one of a plurality of evaluation pull-down devices, coupled to a clock source, a second voltage source, and the at least one bit-line, and adapted to be operable to couple the at least one local bit-line to the second voltage source during the clock signal pulse to discharge the at least one local bit-line.

29 Claims, 4 Drawing Sheets

MEMORY ARRAY WITH PRECHARGE CONTROL CIRCUIT

BACKGROUND

1. Technical Field

Embodiments of the present invention are related to the field of electronic devices, and in particular, to memory devices.

2. Description of Related Art

Referring to FIG. 1, conventional processor designs typically include one or more register files 10 located on the processor chip to provide data to the execution resources with very low latencies. Typically, a register file 10 includes memory array 12, and multiple read and write ports (not shown) to access selected word register entries in the memory array 12. The memory array 12 includes columns and rows of memory cells 14. Each memory cell 14 stores a single bit register entry (logic 0 or logic 1) identified as "Data", with the register entries in a column forming a word register entry. Each port typically includes an address decoder (not shown) and a word-line driver (not shown). Multiple word-lines 15 are selectively driven one-at-a-time by the word-line driver, with one of the word-lines 15 being coupled to each of the columns of memory cells 14 so as to be able to provide an enable signal EN to each of the word register entries. The register file 10 also includes multiple local bit-lines 16, with one of the local bit-lines 16 being coupled to the memory cells 14 in one of the rows. In response to the enable signal EN provided over a selected word-line 15, a word register entry is fed, one Data bit at a time, over the multiple local bit-lines 16 to a single global bit-line 17. In one design, there are different bit-lines for read operations and write operations.

The register file 10 may be implemented with multiple domino logic circuits 18. Each local bit-line 16 forms a domino node for one of the domino logic circuits 18, with each bit-line 16 being coupled the drain of a PMOS precharge transistor P1 (pull-up device) and the drains of multiple, cascaded pairs of NMOS transistors N1 and N2 (pull down devices forming domino stages). The gate of the precharge transistor P1 is coupled to a precharge clock signal. The gates of the transistors N1 and N2, respectively, are coupled to a read-enable signal Rden and the Data state stored in one of the memory cells 14. The signal Rden is provided by ANDing a clock signal CK and the enable signal EN via an AND gate 19. Typically, the precharge clock signal and the clock signal CK have the same frequency and phase. The voltage state of the Data stored in the memory cell 14, consisting of a logic 0 (low voltage state) or a logic 1 (high voltage state), drives the gate of the transistor N2. The precharge transistor P1 is connected between a supply voltage $V_{CC}$ and the associated local bit-line 16. The transistors N1 and N2 provide a series connection between the associated local bit-line 16 and ground.

The operation of each of the domino logic circuits 18 is divided into a precharge phase and an evaluation phase, with the mode of operation being delineated by the clock signals. When the precharge clock signal is low (logic 0), the local bit-line 16 is precharged to the supply voltage $V_{CC}$ by the precharge transistor P1. During this precharged phase, the evaluate transistors N1 are off, so that the pull down paths to ground are disabled. When the precharge clock signal is high (logic 1), the precharge transistor P1 is off and the evaluate transistor N1 is turned on. For example, to read the Data state in a given cell 14, the signal Rden for that cell is brought high so that the evaluate transistor N1 conducts. If Data is in a low voltage state, the transistor N2 does not conduct and prevents the associated local bit-line 16 from discharging. When the precharge clock signal subsequently goes low, there is no need to recharge the local bit-line 14. If Data is in its high voltage state, the transistor N2 conducts and allows the local bit-line 14 to discharge. When the precharge clock signal subsequently goes low, the local bit-line 14 is recharged through the precharge transistor P1. In summary, the local bit-line 14 is charged to an initial precharged state and then, depending on the voltage state of Data in a selected cell 14, the precharged state is maintained or discharged.

Each of the local bit-lines 16 is coupled to the global bit-line 17 through an inverter 20 and a NMOS pull-down transistor N3. When the local bit-line 16 evaluates to logic 0, then the transistor N3 pulls down the global bit-line 17 to logic 0 from its precharged state; hence, the local bit-line 16 provides its Data value to the global bit-line 17. The global bit-line 17 is coupled to a set-dominate latch (SDL) 22. The SDL 22 has coupled thereto its own precharge transistor P2, which is driven by the precharge clock signal. The SDL 24 is a dynamic state device used for holding a logic state, which in this case is the Data value.

Register file 10 may create significant power demands on the processor. Domino logic provides greater speed and lower loading than static logic in return for greater power dissipation. The register file 10 has clock power dissipation on the precharge clock nodes. Prior art designs have used clock gating to prevent the precharge clock node from switching under certain conditions when precharge may not be necessary. However, when precharge is necessary and all of the Data voltage states are low (logic 0s), then precharge clock will continue to dissipate power. In other words, even though the stream of zeroes does not cause the domino logic circuit 18 to toggle between charged and discharged phases, the logic gates of transistors P1 and N1 continue to toggle between high and low states in response to different phases of the clock signals, thereby consuming additional power.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 1:
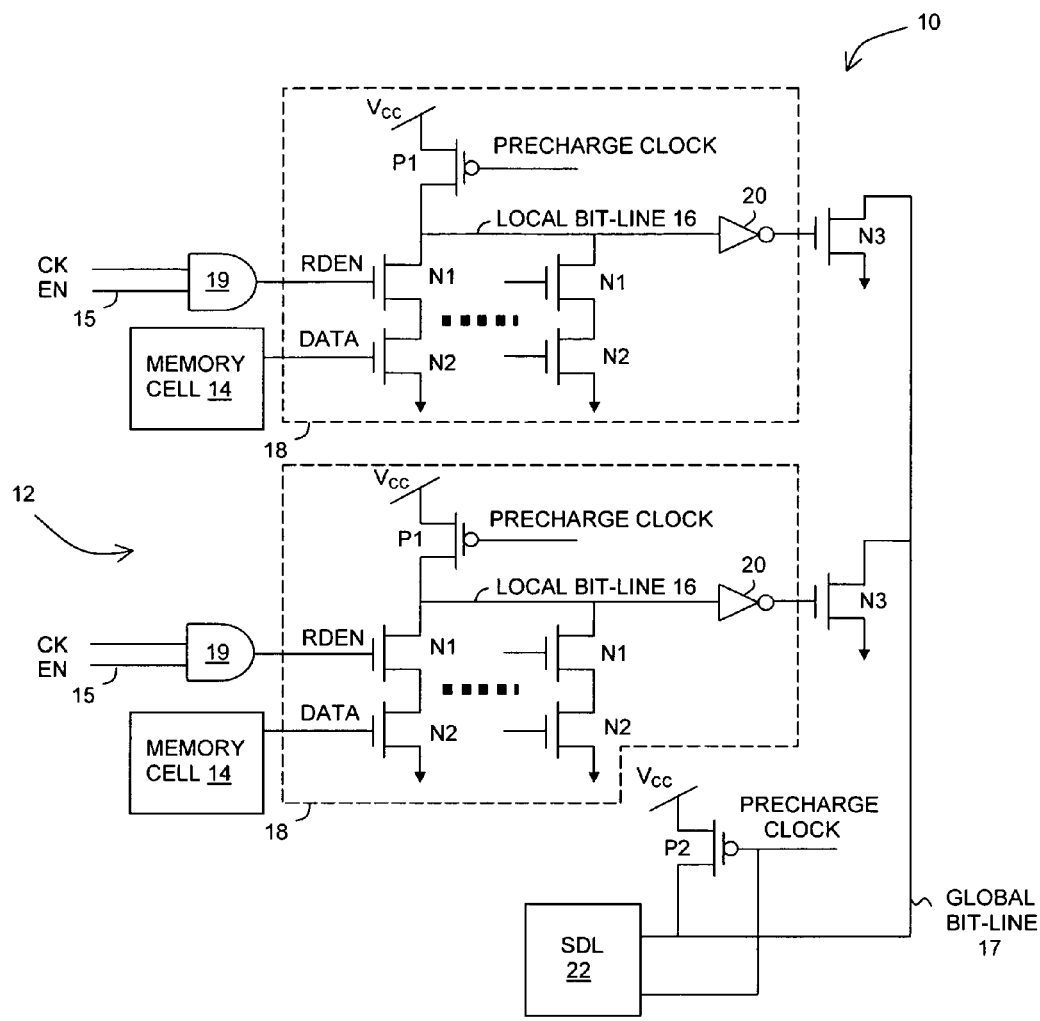
FIG. 1 is a schematic circuit diagram of a conventional register file.
Figure 2:
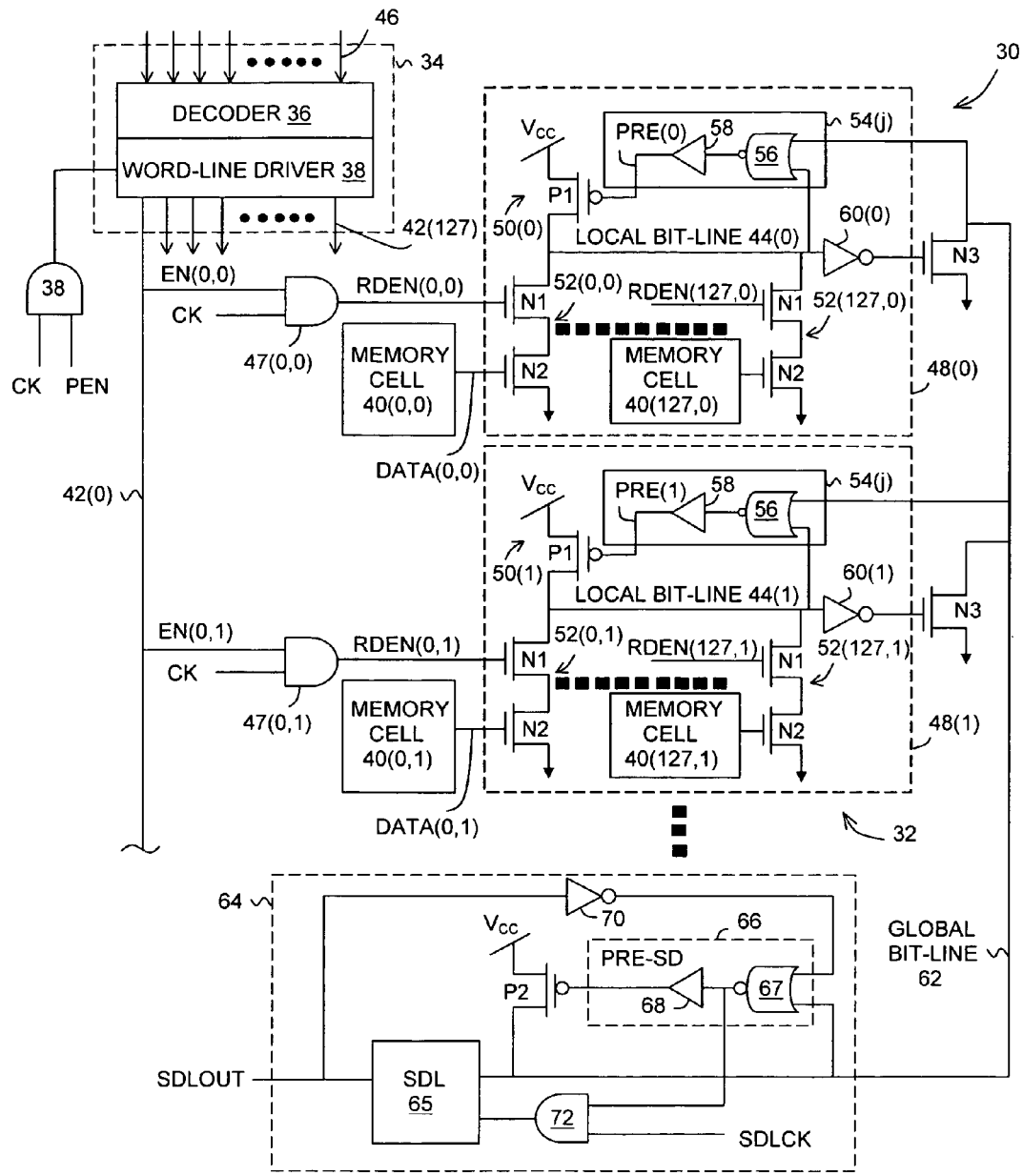
FIG. 2 is a schematic circuit diagram of a register file in accordance with one embodiment of the present invention.

With reference to FIG. 2, there is illustrated a register file 30, according to one embodiment of the present invention. As with the prior art register file in FIG. 1, the operation of the register file 30 includes a precharge phase and an evaluation phase for a selected local bit-line; however, the precharge clock for the precharge phase and its associated power dissipation are significantly reduced or substantially eliminated. Although the evaluation phase may be still triggered by a clock signal, triggering of the start of the precharging of the selected local bit-line is dependent upon completion of a discharge during the evaluation phase. Likewise, turning off the precharging of the selected local bit-line is dependent upon completion of the precharging. Hence, a precharge pulse may control the timing of the precharging with the leading and trailing edges of the precharge pulse being based upon one or more voltage levels of the local and/or global bit-lines affected by the precharging. Additionally, in one embodiment, this precharge pulse may be delayed, lengthened and/or chopped to eliminate any overlap between the evaluation and precharge phases. For example, in one embodiment, buffers may be inserted to delay the precharge pulse so as to ensure that there are enough delays to derace power contention and to ensure full precharge.

The register file 30 may include multiple read and write ports to access selected entries in its memory array 32. A single port 34 is shown in FIG. 2 for purpose of illustration. The port 34 may include an address decoder 36 and a word-line driver 38. The port 34 may be enabled by an enable signal PEN when ANDed with a clock signal CK by an AND gate 39. In one embodiment, the memory array 32 may have a plurality of word entries with each word entry including a plurality of bits. Hence, the memory array 32 may have columns and rows of memory cells 40(i,j), with the index "i" specifying the column and the index "j" specifying the row. Each of a plurality of word entries may be stored in the memory cells 40(i,j) arranged in one of the columns. The plurality of bits of each word entry may be distributed over the rows within the column, with there being one bit ("Data") of the word entry in each of the rows.

Each column of memory cells 40(i,j) may be coupled to a given word-line 42(i) and each row of memory cells 40(i,j) may be coupled to a local bit-line 44(j). Hence, each of the word-lines 42(i) from the word-line driver 38 may access one of the word entries (i), with the local bit-lines 44(j) being used to read out the plurality of bits of the word entry (i). Each of the memory cells 40(i,j) may provide for storage of one bit of each word entry (i), with each of the bits being designated by Data(i,j). Address lines 46 for the address decoder 36 may receive a read address that selects a corresponding one of word-lines 42(i), with the selected word-line 42 accessing a word entry (i) to be read. The address decoder 36 also may generate an enable signal EN(i,j) on the selected word-line 42(i). The enable signal EN(i,j) is ANDed with the clock signal CK via an AND gate 47(i,j) to generate a read-enable signal Rden(i,j) for reading a given Data(i,j) value or state.

For purposes of illustration, in one embodiment, the memory array 32 may be shown having 128 word entries (i=0 to 127) of 64 bits each (j=0 to 63), as illustrated in FIG. 2. Hence, the word-lines 42(0)–42(127) from the word-line driver 38 may be associated with word entries (0)-(127), respectively, and local bit-lines 44(0)–44(63) may be provided for reading out each of the 64 bits of a word entry. The enable signal EN(0)-EN(63) selects one out of 64 memory cells of a given word entry. In FIG. 2, memory cells 40(0,0) and 40(0,1) may store the first two bits of the first word entry (0) in the first column and memory cells 40(127,0) and 40(127,1) may be the first two bits of the last word entry (127) in the last column. The other rows and columns are not explicitly shown. In the illustrative embodiment of FIG. 2, different bit-lines may be used to read and write to the memory cells 40, with local bit-lines 44 being used for the read operation. In one phase of the clock, a read operation may be undertaken using the bit-lines 44 and in a different phase of the clock a write operation may undertaken using different set of bit-lines (not shown).

Referring to FIG. 2, the register file 30, in accordance to one embodiment of the present invention, includes a plurality of domino logic circuits 48(j). In one embodiment, there may be one domino logic circuit 48(j) for each of the bit-lines 44(j), with two domino logic circuits 48(0) and 48(1) being explicitly shown in FIG. 2. Each local bit-line 44(j) may form a domino node of the domino logic circuits 48(j). A precharge pull-up device 50(j) may be coupled to each of the local bit-lines 44(j). Each precharge pull-up device 50(j) may include P-type precharge transistor P1 with a drain coupled to the associated local bit-line 44(j) and a source coupled to a first reference voltage, e.g., supply voltage $V_{CC}$. The gate of the precharge transistor P1 is coupled to a precharge signal PRE(j) containing one or more precharge pulses to turn ON and OFF the precharge transistor P1, which will be discussed hereinafter. A plurality of cascaded, evaluation pull-down devices 52(i, j) may be coupled to the associated local bit-line 44(j). Each of the evaluation pull-down devices 52(i,j) may include a plurality of serially-connected N-type transistors N1 and N2 with a drain of the transistor N1 coupled to the local bit-line 44(j) and the source of the transistor N2 coupled to a second reference voltage, e.g., ground. The gate of the transistor N1 is coupled to its respective read-enable signal Rden(i,j) and the gate of the transistor N2 is coupled to its respective memory cell 40(i,j).

Referring back to the precharge pull-up device 50(j), each of the domino logic circuits 48(j) may include a clock-independent, precharge control circuit 54(j). Instead of being coupled to a precharge clock signal as in the prior art, the gate of the transistor P1 of the pull-up device 50(j) is coupled to the precharge signal PRE(j) generated by the precharge control circuit 54(j). The precharge control circuit 54(j) may include a NOR gate 56 with an output coupled to an inverting delay buffer 58. The inverting delay buffer 58 delays the output signal from the NOR gate 56 to generate the precharge signal PRE(j). In one embodiment, the inverting delay buffer 58 may include an odd number of delay stages.

In one embodiment, each of the bit-lines 44(j) may be connected to a static inverter 60(j) and each of the inverters 60(j) may be coupled to a pull-down N-type transistor N3. The drains of the transistors N3 may be coupled to a global bit-line 62. The global bit-line 62 may be coupled to a data capture circuit 64 to be described hereinafter. Each of the NOR gates 56 has a pair of inputs: one coupled to the associated bit-line 44(j) and the other connected to the global bit-line 62.

Figure 3:
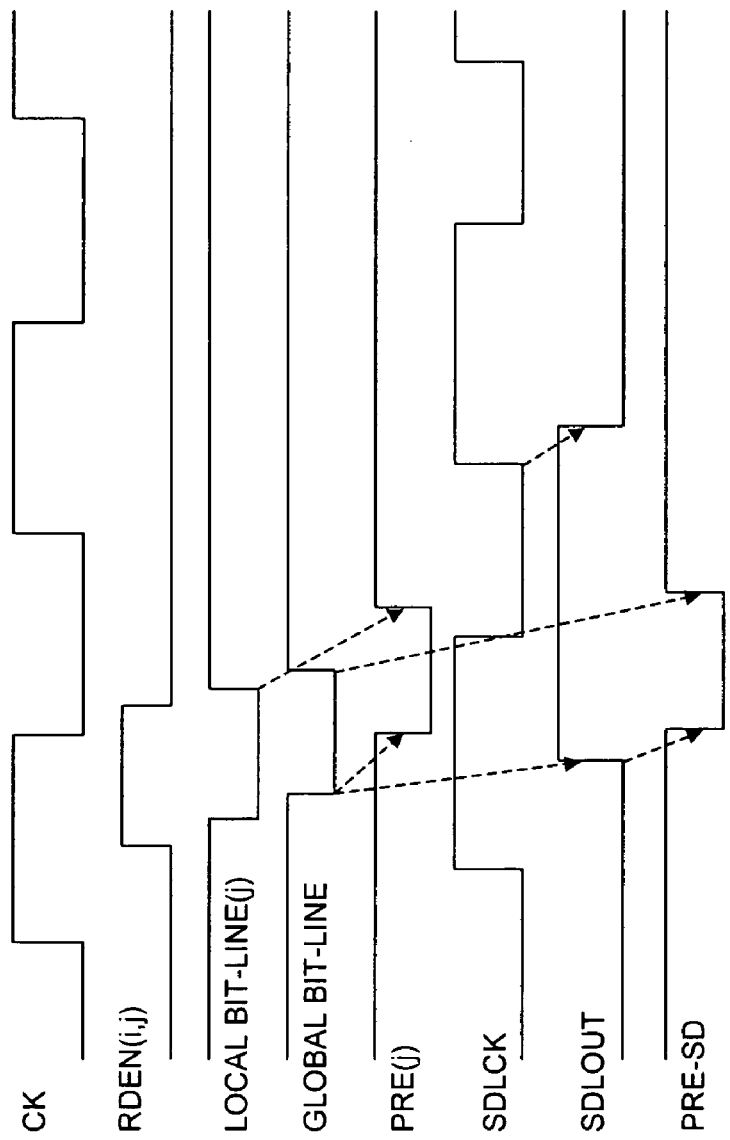
FIG. 3 is a timing diagram for the register file of FIG. 2.

With reference to FIGS. 2 and 3, the operation of the register file 30 shown in FIG. 2 will be described with reference to a timing diagram of FIG. 3. In response to the read-enable signal Rden(i,j) on one of the word-lines 42(i), a selected domino logic circuit 48(j) accesses a selected Data(i,j) bit in a selected word entry (i) and outputs it via the associated local bit-line 44 to the global bit-line 62, where the Data may then be latched by the data capture circuit 64. As previously mentioned, accessing a stored Data value initiates an evaluation phase of the selected domino logic circuit 48(j), which may be followed by a precharge phase if the selected local bit-line 44 is discharged during the evaluation phase. This operation will now be described in detail.

Prior to a read operation, the register file 30 is in an initialized state wherein all the local bit-lines 44(j) and the global bit-line 62 are initially precharged to a high voltage state or high ("logic 1"). In this initialized state, the read-enable signals Rden(i,j) on each of the word-lines 42(i) are in a low voltage state or low (consecutive 0s) so that the gates of the evaluate transistors N1 of all the pull-down devices 52(i, j) receive logic 0s; hence, the transistors N1 are OFF. The two inputs to each of the NOR gates 56 are logic 1s, so that the outputs of the NOR gates 56 are logic 0s. In this initialized state, sufficient time has passed for the logic 0s to propagate through and be inverted by the inverting delay buffers 58 so that the precharge signal PRE(j) for the gates of the precharge transistors P1 of the pull-up devices 50(i,j) are logic 1 s and therefore all the precharge transistors P1 are turned OFF. In summary, signals Rden(i,j)=0s; local bit-lines(j)=1; global bit-line=1; NOR outputs=0; PRE(j) gate signals=1. Therefore, the precharge transistors P1 are OFF with the precharging phase having previously been undertaken. The evaluate transistors N1 also are OFF with the local bit-lines 44(j) being unable to discharge through the transistors N1 and N2 to ground.

Now assume a read operation is initiated by enabling the word-line driver 38 with the enable signal PEN. The address decoder 36, in response to the multi-bit address 46, generates an enable signal EN(i,j) on a selected one of the word-lines 42(i). The enable signal EN(i,j), when ANDed with the clock signal via the AND gate 47(i,j), generates the read-enable signal Rden(i,j). The ANDing with the clock signal CK results in the read-enable signal Rden(i,j) turning on the evaluate transistor N1 for the duration of a clock pulse (one phase of the clock signal CK). Each read-enable signal Rden(i,j) may have a number of bits equal to the number of domino logic circuits 48(j). One of the bits may be a logic 1 to select one of the domino logic circuits 48(j) and the remaining bits may be logic 0s. For example, in the previously-described illustrative register file 30, there may be 128 word entries with each word entry having 64 bits. In this example, the signal Rden[64:0] is sent over one of the 128 word-lines coupled to a selected word entry (i). The read-enable signal Rden(i,j) may turn ON the transistor N1 of one of the 64 memory cells(i,j) in a word entry (i) for one clock pulse (clock phase). In other words, for the selected memory cell(i,j), signal Rden=1. In summary, the selected word-line 42(i) selects one of the word entries in the columns of the memory array 32 and the signal Rden (i,j), when placed on the selected word-line 42(i), further selects the bit of the word entry to be read.

During this evaluation phase, with the transistor N1 turned ON, if the selected memory cell(i,j) contains Data(i,j) that is a logic 1, the associated transistor N2 is turned ON, so that the associated local bit-line 44(j) discharges through the transistors N1 and N2 to ground. On the other hand, if the memory cell 40(i,j) contains Data(i,j) that is a logic 0, the associated transistor N2 remains OFF, so that the local bit-line 44(j) cannot discharge through the transistors N1 and N2 to ground. Hence, during this evaluation phase, there are two possible states: (a) the signal Rden(i,j)=1 and Data(i,j)=1 for the selected cell(i,j) or (b) the signal Rden (i,j)=1 and Data(i,j)=1 for the selected cell(i,j). These two possible states during the evaluation phase are discussed in detail below.

With respect to the first possible state during the evaluation phase where the signal Rden(i,j)=1 and Data(i,j)=1 for the selected cell(i,j), the associated local bit-line 44(j) is discharged to ground because the transistor N2 is turned ON by Data(i,j)=1 and the transistor N1 is turned ON by signal Rden(i,j)=1. Referring to FIG. 3, the associated local bit-line 44 transitions from logic 1 to logic 0 and, with a small delay caused by the static inverter 60 and transistor N3, the global bit-line 62 transitions from logic 1 to logic 0. After the bit-lines 44 and 62 become logic 0s, the output of the NOR gate 56 becomes logic 1. The precharge signal PRE(j) of the inverting delay buffer 58 remains at a logic 1 (allowing discharge) until the output of the NOR gate 56 propagates through and is inverted by the delay buffer 58; hence, the precharge signal PRE(j) remains at logic 1 during this period of buffer delay. The precharge transistor P1 remains OFF (not precharging) until the precharge signal PRE(j) becomes a logic 0. In other words, the delay buffer 58 may be viewed as delaying the leading edge (e.g., falling edge in this example) of the precharge pulse which triggers the beginning of the precharge phase following evaluation when the leading edge reaches the gate of the precharge transistor P1. In summary, the one of the bit-lines 44 evaluates to logic 0 by discharge through the transistors N1 and N2 during an evaluation phase, with the subsequent precharge phase not beginning until the changed output state of the NOR gate 56 propagates through the delay of the delay buffer 58 and the precharge transistor P1 is turned on.

During the precharge phase following the above-described evaluation phase, the local bit-line 44 waveform transitions from logic 0 to logic 1, and after the small delay of the static inverter 60 and transistor P3, the waveform of the global bit-line 62 transitions from logic 0 to logic 1. Upon the bit-lines 44 and 62 becoming logic 1s, the output of the NOR gate 56 becomes logic 0. However, the precharge signal PRE(j) remains at a logic 0 (therefore charging continues) until the changed output of the NOR gate 56 propagates through and is inverted by the delay buffer 58; hence, the precharge signal PRE(j) remains at logic 0 during this period of buffer delay. Consequently, the transistor P1 remains ON (precharging) until the precharge signal PRE(j) becomes a logic 1. In summary, the precharge transistor P1 is ON and the bit-lines 44 and 62 charge until the precharge signal PRE(j) becomes logic 1 and the transistor P1 is turned OFF.

After precharging ends with the occurrence of the trailing edge (e.g., rising edge in this example) of the precharge pulse at the gate of the transistor P1, the local bit-line=1, the global bit-line=1, the NOR output=0, the signal PRE(j)=1, and signal Rden=0s. The bit-lines 44 and 62 are charged and the register file 30 is waiting for the next read-enable signal Rden=1 for a memory cell(i,j), which is the same as the previously described initialized state. When the port 34 is not in use, the enable signal PEN is driven low, signaling a power-down condition.

With respect to the second possible state during the evaluation phase where the Rden(i,j)=1 and Data(i,j)=0 for the selected cell(i,j), the associated local bit-line 44(j) is not discharged because transistor N2 remains turned OFF by Data(i,j)=0. More specifically, the associated local bit-line 44(j) remains at logic 1 and there is no transition and no discharge; the global bit-line 62 remains at logic 1 and there is no transition and no discharge; the output of the NOR gate 56 remains at 0, and the precharge signal PRE(j) remains at logic 1. Consequently, the precharge transistor P1 remains OFF and the bit-lines 44 and 62 do not discharge. There is no subsequent precharge phase, because the bit-lines 44 and 62 are already charged and remain in this precharge state until another evaluation phase when one of the bit-lines 44(j) evaluates to logic 0.

Referring to FIGS. 2 and 3, the delay buffer 58 may delay the start (leading edge) of precharge pulse of the signal PRE(j) relative to the end of the signal Rden(i,j) to avoid power contention. Additionally, the delay buffer 58 may delay the end (trailing edge) of the precharge pulse to ensure sufficient precharging of the bit-lines 44(j) and 62. In the illustrative embodiment, the leading edge of the precharge pulse is a falling edge and the trailing edge of the precharge pulse is a rising edge. In other words, the falling edge and the subsequent rising edge of the precharge signal PRE(j) defines the "precharge pulse" which turns ON and then OFF the precharge transistor P1. The delay buffer 58 generally delays both the rising and falling edges of the precharge pulse equally, but in other embodiments, the delays of the two edges may be different to either chop or lengthen the pulse generated by the NOR gate 56.

As previously mentioned, the delay buffer 58 may be inserted after the NOR gate 56 to ensure there are enough delays to derace power contention and ensure full precharge. With respect to the waveforms of the local bit-line 44(j) and the global bit-line 62, when the waveforms are logic 1, this is defined as a "precharge state" of the bit-lines and when the waveforms are logic 0, this is defined as a "discharge state" of the bit-lines. The start of precharge state of the local bit-lines 44 (when local bit-line voltage transitions from low to high) needs to occur after the Rden(i,j) signal transitions from high to low to avoid contention. Likewise, the start of precharge state for global bit-line 62 (when global bit-line voltage transitions from low to high) needs to occur after the pull-down transistors N3 have been shut-off to avoid discharge to ground. The delay of the delay buffers 58 also needs to be enough to ensure the end of precharge states of the local/global bit-lines occurs after local/global bit-lines are fully precharged. Without enough delay, the end of precharge pulse may occur before the local/global bit-lines charged to full supply voltage $V_{CC}$ value and may therefore cause data corruption.

The precharge control circuit 54(j) may include other logic combinations to generate the desired triggering of the beginning and the ending of the precharge pulse. For example, the precharge control circuit 54(j) may include an OR gate and a non-inverting delay buffer. With the NOR gate 56 (or like logic circuit), the voltage level of both the local bit-line 44(j) and the global bit-line 62 are detected to ensure that the global bit-line 62 is properly discharged. In order to reduce the dependency on the process variation, this is an additional way to ensure that the pull-down transistors N3 for the global bit-line 62 are not disabled before the global bit-line 62 is fully discharged.

In an alternative embodiment, instead of detecting both the bit-lines 44(j) and 62 using logic circuitry such as the NOR gate 56, either the local bit-line 44(j) or the global bit-line 62 may be detected to determine the precharge state and discharge state of the bit-lines. However, this alternative embodiment may require additional delay through the NOR gate 46 and the inverting delay buffer 58 to make sure that the global bit-line 62 is discharged completely. In other words, this alternative embodiment may be less robust with process variation. A simple CMOS threshold detector (not shown) may be used in place of the NOR gate 56, with its input coupled to the local bit-line 44(j) or the global bit-line 62. Additional delay (e.g., more delay stages of the delay buffer 58) may be required to sufficiently increase the delay to ensure that the global bit-line 62 is discharge fully despite process variation. However, use of a logic circuit having inputs detecting or sensing both bit-lines 44(j) and 62, as shown in FIG. 2, is more desirable and less vulnerable to process delay.

Referring to FIGS. 2 and 3, in conclusion, the beginning of the evaluation phase of a selected domino logic circuit 48(j) may be triggered by the clock signal CK, as occurs in the prior art implementation of FIG. 1. Precharging of the selected bit-line 44(j) occurs during the precharge pulse, with the precharging being initiated by the leading edge of the precharge pulse and terminating with the trailing edge of the precharge pulse. Unlike the prior art, the precharge pulse is not determined by a precharged clock. Instead, the start (leading edge) of the precharge pulse may be triggered by the completion of the discharge during the evaluation phase (beginning of the precharge state for the local and/or global bit-lines) after a predetermined buffer delay. Likewise, the end (trailing edge) of the precharge pulse may be triggered by the completion of the precharging (end of precharge state for the local and/or global bit-lines) after a predetermined buffer delay. Thereafter, the domino logic circuits 48(j) wait for the next read operation.

Referring back to FIG. 2, the data capture circuit 64 may include a set-dominant latch (SDL) 65 coupled to the global bit-line 62 to latch the Data(i,j) placed on the global bit-line 62 by the domino logic circuits 48. The data capture circuit 64 may include a global line precharge transistor P2 and a clock-independent, global line precharge control circuit 66. The precharge transistor P2 may be coupled between the supply voltage $V_{CC}$ and the global bit-line 62. The global line precharge control circuit 66 may include a NOR gate 67 and an inverting delay buffer 68. The NOR gate 67 may have a pair of inputs: one coupled to the global bit-line 62 and the other coupled to an output signal SDLOUT of the SDL 65 through a static inverter 70. The output of the NOR gate 67 is coupled through the inverting delay buffer 68 to provide a precharge signal PRE-SD to the gate of the precharge transistor P2. An AND gate 72 has two inputs: an SDLCK clock and the output of the NOR gate 67. However, unlike the prior art design of FIG. 1, no clock is used to drive the gates of the precharge transistors P1. In one embodiment, the precharge clock shown in FIG. 1 may be used as the clock signal SDLCK in FIG. 2. The global line precharge control circuit 66 replaces the precharge clock of FIG. 1 in the same manner as the precharge control circuits 54 replaced the precharge clock of FIG. 1. Hence, the global line precharge control circuit 66 may trigger the start and the end of the precharging of the transistor P2.

In operation, the AND gate 72 may be used to prevent the Data signal or precharge value from being latched into the SDL 65. The clock signal SDLCK may be turned to fall before PRE-SD goes low. But clock skew may need to be taken into account. To accomplish this, the clock signal SDLCK needs to fall considerably earlier to avoid this min-delay issue. This in turn may hurt the evaluation time of the SDL 65. To reduce this difficulty, the AND gate 72 may make sure the SDL clock input falls before PRE-SD falls (start of precharge). In this manner, the skew may be reduced because all devices are nearby. Hence, the clock signal SDLCK may have the same frequency as the clock signal CK, but its edges may be adjusted relative to the clock signal CK to provide this tuning.

Relative to the prior art register file of FIG. 1, one potential benefit of the register file 30 of FIG. 2, according to one embodiment of the present invention, may be the reduction of clock power. With the register file 30, the precharge clock has been completely eliminated. In turn, this means that the wire capacitance and clock chopper circuitry power dissipation has been eliminated. For example, when all of the Data in the register file 30 is logic 0, the local and global bit-lines 44 and 62 evaluate to logic 1, which means no discharge. The precharge signal PRE(j) and PRE-SD stay at a logic 1 (no precharge pulse), which means the pull-up precharge transistors P1 and P2 are OFF. This in turn means that there is virtually no switching power dissipation, but only leakage power dissipation. To the contrary, the conventional register file of FIG. 1 would have the precharge clock node switching and thus dissipate more power.

The register file 30 may require extra gates, such as those used for the NOR gates 56 and delay buffers 58, but the NOR and delay buffers may have reduced size with long channels. This sizing may cut down on leakage power. To the contrary, in the prior art register file of FIG. 1 the precharge clock load is large; hence, the clock drivers are usually large (minimum length) transistors. Therefore, the register file 30 of FIG. 2 may reduce the use of metal tracks to route the clock signal, with the routing being mostly local to the memory cell 40. For example, in one embodiment, the local bit-line 44(j) may be an M3 with 0.12 um width and 60 um of length. The global bit-line 62 may be M3 with 0.12 um width and 150 um for each section. The precharge transistors P1 and P2 may be minimum length transistors with a width of 1.4 um and 2.3 um each. The NOR gate 56 for the precharge control may include 0.2 um/0.05 um transistors and the delay buffer 58 may include 0.2 um/0.05 um transistors. In one embodiment, the pulse width of the precharge pulse may be approximately 100 ps–120 ps, which leaves 240 ps–260 ps for evaluation in a cycle time of 360 ps.

The register file 30 also may less sensitive to the process than the prior art register file of FIG. 1. In the prior art register file of FIG. 1, the clock routes extend over long distances; hence, the clock skew may accumulate quickly. The precharge control circuits 54 are much more local, so the process variation may be relatively smaller. The precharge does not start until one of the domino logic circuits 48 captures the Data (evaluate to logic 0); consequently the signal integrity may be higher compared to the prior art clocked method. With high clock skew of the prior art design, the precharge may happen too early or slow so as to compromise the signal integrity.

In summary, the register file 30, according to one embodiment of the present invention, may reduce the clock loading and power dissipation due to the clock. The file register may be more robust and less sensitive to the clock skew.

Figure 4:
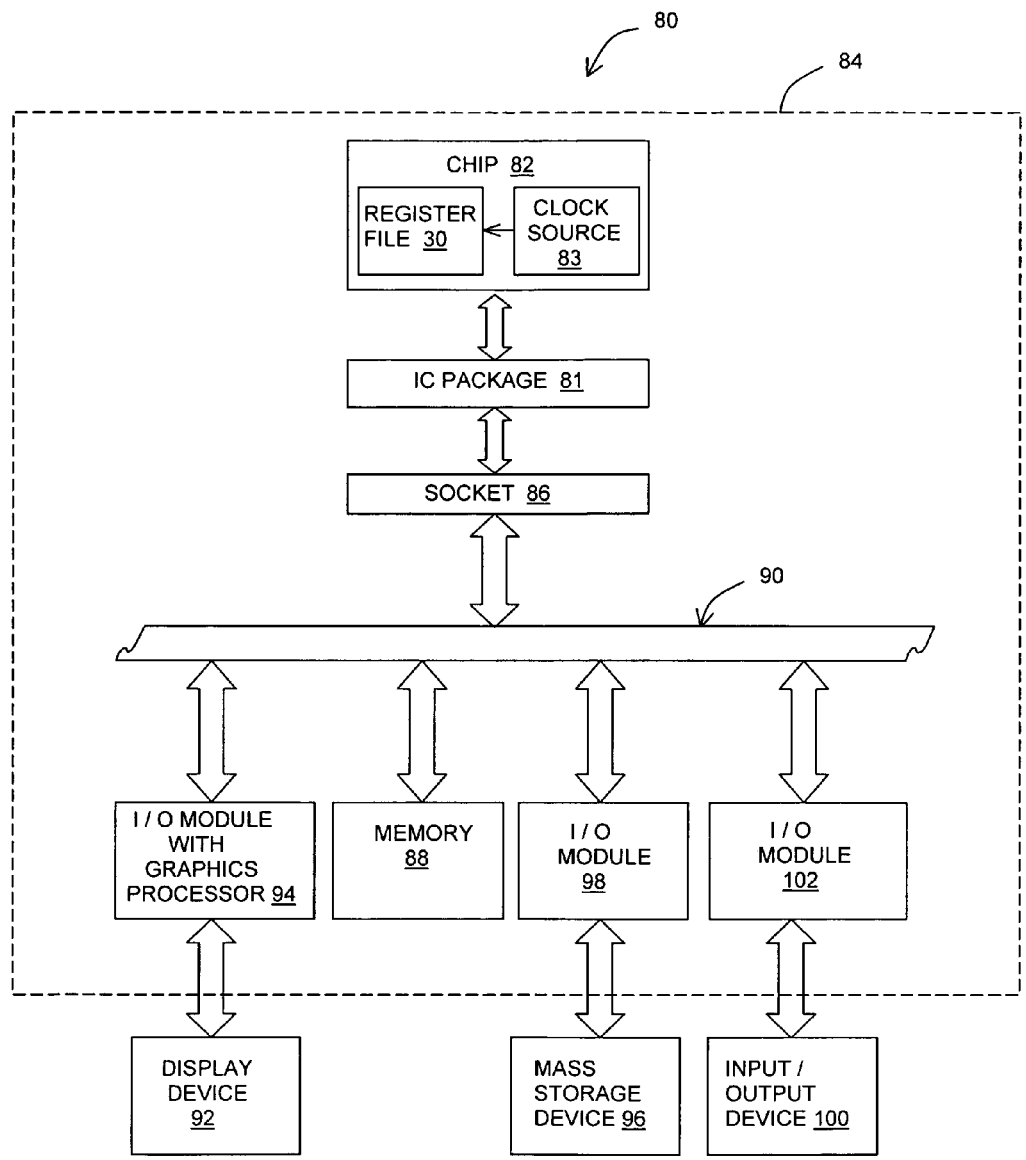
FIG. 4 is a system incorporating the register file of FIG. 2 in accordance with one embodiment of the present invention.

Referring to FIG. 4, there is illustrated a system 80, which is one of many possible systems in which the register file 30 of FIG. 2 may be used. The system 80 includes an IC package 81 having a processor chip 82. The processor chip 82 includes one or more the register files 30 and a clock source 83 for generating the clock signals CK and SDLCK. The one or more register files 30 may be located on the processor chip 82 to provide data to the execution resources with low latencies. Other storage structures include on-chip caches, off-chip caches, and a main memory, which provide data to execution resources with correspondingly longer latencies, some of which will be described hereinafter.

In the system 80 the IC package 81 is mounted on a substrate or printed circuit board (PCB) 84 via a socket 86. The PCB 84 may be a motherboard. However, in other systems the IC package 81 may be directly coupled to the PCB 84 (eliminating the socket 86 which allows the IC package 81 to be removable). In addition to the socket 86 and the IC package 81, the PCB 84 may have mounted thereon a main memory 88 and a plurality of input/output (I/O) modules for external devices or external buses, all coupled to each other by a bus system 90 on the PCB 84. More specifically, the system 80 may include a display device 92 coupled to the bus system 90 by way of an I/O module 94, with the I/O module 94 having a graphical processor and a memory. The I/O module 94 may be mounted on the PCB 84 as shown in FIG. 4 or may be mounted on a separate expansion board. The system 80 may further include a mass storage device 96 coupled to the bus system 90 via an I/O module 98. Another I/O device 100 may be coupled to the bus system 90 via an I/O module 102. Additional I/O modules may be included for other external or peripheral devices or external buses.

Examples of the main memory 88 include, but are not limited to, static random access memory (SRAM) and dynamic random access memory (DRAM). The memory 88 may include an additional cache memory. Examples of the mass storage device 96 include, but are not limited to, a hard disk drive, a compact disk drive (CD), a digital versatile disk driver (DVD), a floppy diskette, a tape system and so forth. Examples of the input/output devices 100 may include, but are not limited to, devices suitable for communication with a computer user (e.g., a keyboard, cursor control devices, microphone, a voice recognition device, a display, a printer, speakers, and a scanner) and devices suitable for communications with remote devices over communication networks (e.g., Ethernet interface device, analog and digital modems, ISDN terminal adapters, and frame relay devices). In some cases, these communications devices may also be mounted on the PCB 84. Examples of the bus system 90 include, but are not limited to, a peripheral control interface (PCI) bus, and Industry Standard Architecture (ISA) bus, and so forth. The bus system 90 may be implemented as a single bus or as a combination of buses (e.g., system bus with expansion buses). Depending upon the external device, I/O modules internal interfaces may use programmed I/O, interrupt-driven I/O, or direct memory access (DMA) techniques for communications over the bus system 90. Depending upon the external device, external interfaces of the I/O modules may provide to the external device(s) a point-to point parallel interface (e.g., Small Computer System Interface—SCSI) or point-to-point serial interface (e.g., EIA-232) or a multipoint serial interface (e.g., FireWire). Examples of the IC chip 82 may include any type of computational circuit such as, but not limited to, a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

In various embodiments, the system 80 may be a wireless mobile or cellular phone, a pager, a portable phone, a one-way or two-way radio, a personal digital assistant, a pocket PC, a tablet PC, a notebook PC, a desktop computer, a set-top box, an entertainment unit, a DVD player, a server, a medical device, an internet appliance and so forth.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A memory apparatus, comprising:
    at least one local bit-line;
    a precharge control circuit, coupled to the at least one local bit-line, and adapted to be operable to initiate a precharge pulse after the at least one local bit-line is discharged and to terminate the precharge pulse after the at least one local bit-line has been precharged;

a precharge pull-up device, coupled to the precharge control circuit, a first voltage source, and the at least one local bit-line, and adapted to be operable to connect the first voltage source to the at least one local bit-line during the precharge pulse to precharge the at least one local bit-line; and a selected one of a plurality of evaluation pull-down devices, coupled to a clock source, a second voltage source, and the at least one local bit-line, and adapted to be operable to couple the at least one local bit-line to the second voltage source during the clock signal pulse to discharge the at least one local bit-line.

2. The memory apparatus according to claim 1, wherein the precharge control circuit is adapted to be responsive to a voltage level of the at least one local bit-line to initiate the precharge pulse and to terminate the precharge pulse.

3. The memory apparatus according to claim 1, wherein the at least one local bit-line includes a plurality of local bit-lines and the memory apparatus further comprises a global bit-line coupled to the plurality of local bit-lines.

4. The memory apparatus according to claim 3, wherein the precharge control circuit is adapted to be responsive to a voltage level of at least the global bit-line to initiate the precharge pulse and to terminate the precharge pulse.

5. The memory apparatus according to claim 3, wherein the precharge control circuit is adapted to be responsive to both a first voltage level of the global bit-line and a second voltage level of a selected one of the plurality of local bit-lines.

6. The memory apparatus according to claim 3, wherein the precharge control circuit includes a logic gate circuit having a first input terminal coupled to a selected one of the plurality of local bit-lines and a second input terminal coupled to the global bit-line; and a delay element having an input terminal coupled to an output terminal of the logic gate circuit and an output terminal coupled to a gate of the precharge pull-up device.

7. The memory apparatus according to claim 3, wherein the precharge control circuit includes a NOR gate having a first input terminal coupled to a selected one of the plurality of local bit-lines and a second input terminal coupled to the global bit-line; and an inverting delay buffer having an input terminal coupled to an output terminal of the NOR gate and an output terminal coupled to a gate of the precharge pull-up device.

8. The memory apparatus according to claim 1, wherein the precharge control circuit includes a delay element to delay the precharge pulse.

9. The memory apparatus according to claim 1, wherein the precharge pulse includes a leading edge triggered by the discharge of the at least one local bit-line and a trailing edge triggered by the precharge of the at least one local bit-line; and the precharge control circuit is adapted to be operable to delay at least a selected one of the leading edge and the trailing edge.

10. The memory apparatus according to claim 1, wherein each of the evaluation pull-down devices includes a first N-type transistor with a drain terminal coupled to the at least one local bit-line and a gate terminal coupled to the clock source; a second N-type transistor having a drain terminal coupled to a source terminal of the first N-type transistor and a source terminal coupled to the second voltage source; and a memory cell coupled to the gate terminal of the second N-type transistor.

11. The memory apparatus according to claim 10, wherein the memory cell is adapted to contain a data bit; the selected one of the plurality the evaluation pull-down devices is adapted to be operable to maintain the precharge of the at least one local bit-line for one state of the data bit and to discharge the at least one local bit-line for another state of the data bit; and the memory apparatus further comprises:

a word-line driver with a plurality of word-lines coupled thereto; and a plurality of AND gates, with each of the AND gates having a first input terminal coupled to one of the word-lines and a second input terminal coupled to the clock source and an output terminal coupled to the gate terminal of one of the first N-type transistors.

12. The memory apparatus according to claim 10, wherein the precharge pull-up device includes a P-type transistor having a drain terminal coupled to the at least one local bit-line, a source terminal coupled to the first voltage source, and a gate terminal coupled to an output terminal of the precharge control circuit.

13. The memory apparatus according to claim 1, further comprising:

a plurality of columns of memory cells and a plurality of rows of memory cells, with each of the memory cells being coupled to one of the evaluation pull-down devices;

a plurality of word-lines, with each of the word-lines being coupled to one of the columns of memory cells storing a word entry; and the at least one local bit-line including a plurality of local bit-lines, with one of bit-lines being coupled to each of the memory cells in the column containing the word entry.

14. The memory apparatus according to claim 3, further comprising:

a data capture circuit including:

a latch having an input terminal coupled to the global bit-line and an output terminal to generate a latch output signal;

a global line precharge pull-up device coupled between the first supply voltage and the global bit-line; and a global line precharge control circuit having a first input terminal coupled to the global bit-line, a second input terminal coupled to the output terminal of the latch, and an output terminal coupled to a gate to the global line precharge pull-up device.

15. The memory apparatus according to claim 14, wherein the global line precharge control circuit includes a logic gate circuit with the first and the second input terminals of the global line precharge control circuit and a delay element having an input terminal coupled to an output terminal of the logic gate circuit and the output terminal coupled to the latch; and wherein the data capture circuit further includes an AND gate having a first input terminal coupled to the output terminal of the logic gate circuit and a second input terminal coupled to a latch clock signal.

16. A method, comprising:

initially precharging a plurality of local bit-lines, with each of the local bit-lines being coupled to a plurality of memory cells through a plurality of evaluation pull-down devices;

discharging a selected one of the local bit-lines through a selected one of the evaluation pull-down devices during a clock pulse to achieve a discharge state of the selected one of the local bit-lines;

initiating precharging of the selected one of the local bit-lines through a precharge pull-up device in response to the discharge state; and terminating the precharging of the selected one of the local bit-lines in response to achieving a precharge state of the selected one of the local bit-lines.

17. The method according to claim 16, wherein the initiating of the precharging of the selected one of the local bit-lines includes generating a precharge pulse with a leading edge to turn on the precharge pull-up device and a trailing edge to turn off the precharge pull-up device, the leading edge being triggered by the discharged state and the trailing edge being triggered by the precharge state.

18. The method according to claim 17, further comprising:

delaying the precharge pulse with a delay element.

19. The method according to claim 16, further comprising:

the initiating of the precharging of the selected one of the local bit-lines in response to the discharge state includes detecting the selected one of the local bit-lines in a low voltage state; and the terminating of the precharging of the selected one of the local bit-lines in response to achieving the precharge state of the selected one of the local bit-lines includes detecting the selected one of the local bit-lines in a high voltage state.

20. The method according to claim 19, further comprising:

delaying at least a selected one of the initiating of the precharging of the selected one of the local bit-lines and the terminating of the precharge of the selected one of the local bit-lines.

21. The method according to claim 16, further comprising:

performing the initiating of the precharging of the selected one of the local bit-lines in response to the discharge state includes detecting a voltage of a global bit-line in a low voltage state; and performing the terminating of the precharging of the selected one of the local bit-lines in response to achieving the precharge state of the selected one of the local bit-lines includes detecting the voltage of the global bit-line in a high voltage state.

22. The method according to claim 21, further comprising:

delaying at least a selected one of the initiating of the precharging of the selected one of the local bit-lines and the terminating of the precharge of the selected one of the local bit-lines.

23. The method according to claim 16, further comprising:

performing the initiating of the precharging of the selected one of the local bit-lines in response to the discharge state includes detecting both the selected one of the local bit-lines and a global bit-line in a low voltage state; and performing the terminating of the precharging of the selected one of the local bit-lines in response to achieving the precharge state of the selected one of the local bit-lines includes detecting both the selected one of the local bit-lines and the global bit-line in a high voltage state.

24. The method according to claim 23, further comprising:

delaying at least a selected one of the initiating of the precharging of the selected one of the local bit-lines and the terminating of the precharge of the selected one of the local bit-lines.

25. A memory apparatus, comprising:

at least one local bit-line a precharge control circuit, coupled to the at least one local bit-line, and adapted to be operable to perform at least a selected one of initiating a precharge pulse after the at least one local bit-line is discharged and terminating the precharge pulse after the at least one local bit-line has been precharged; and wherein the precharge control circuit is adapted to be responsive to a voltage level of the at least one local bit-line during at least one of said initiating of the precharge pulse and said terminating of the precharge pulse.

26. The memory apparatus according to claim 25, wherein the precharge control circuit includes a delay element to delay the precharge pulse.

27. A memory apparatus, comprising:

at least one local bit-line;

at least one evaluation pull-down device coupled to a clock source, a voltage source, and the at least one local bit-line, and adapted to be operable to couple the at least one local bit-line to the voltage source during a clock signal pulse generated by the clock source to discharge the at least one local bit-line; and circuitry coupled to the at least one local bit-line adapted to provide a precharge pulse to the local bit-line to precharge the local bit-line independent of the clock source.

28. The memory apparatus of claim 27, wherein said circuitry adapted to perform at least a selected one of initiating a precharge pulse to the local bit-line after end of the clock signal pulse and terminating the precharge pulse after the at least one local bit-line has been precharged.

29. The memory apparatus of claim 28, wherein said circuitry includes a precharge pull-up device that is coupled to another voltage source and the at least one local bit-line, the precharge pull-up device adapted to be operable to couple the another voltage source to the at least one local bit-line during the precharge pulse to precharge the at least one local bit-line.

* * * * *